(12) United States Patent
Jeng et al.

(10) Patent No.: US 8,105,947 B2
(45) Date of Patent: Jan. 31, 2012

(54) POST ETCH DIELECTRIC FILM RE-CAPPING LAYER

(75) Inventors: Shwang-Ming Jeng, Hsin-Chu (TW); Kin-Weng Wang, Zhudong Town (TW); Hsin-Yi Tsai, Hsin-Chu (TW); Keng-Chu Lin, Ping-Tung (TW); Chung-Chi Ko, Nantou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 110 days.

(21) Appl. No.: 12/547,232

(22) Filed: Aug. 25, 2009

(65) Prior Publication Data
US 2010/0120253 A1    May 13, 2010

Related U.S. Application Data

(60) Provisional application No. 61/112,584, filed on Nov. 7, 2008.

(51) Int. Cl.
*H01L 21/302* (2006.01)
*H01L 21/311* (2006.01)
*H01L 21/31* (2006.01)

(52) U.S. Cl. ........ 438/689; 438/694; 438/700; 438/761; 438/763; 438/778

(58) Field of Classification Search ........................ None
See application file for complete search history.

(56) References Cited

U.S. PATENT DOCUMENTS

| | | | | |
|---|---|---|---|---|
| 6,114,235 A | * | 9/2000 | Foote et al. | 438/636 |
| 6,720,133 B1 | * | 4/2004 | Ramsbey et al. | 430/312 |
| 6,894,342 B1 | * | 5/2005 | Hui et al. | 257/317 |
| 7,354,856 B2 | * | 4/2008 | Yeh et al. | 438/638 |
| 7,785,484 B2 | * | 8/2010 | Heo et al. | 216/47 |
| 2001/0010976 A1 | * | 8/2001 | Plat | 438/786 |
| 2002/0058370 A1 | * | 5/2002 | Lee et al. | 438/200 |
| 2003/0170993 A1 | * | 9/2003 | Nagahara et al. | 438/694 |
| 2005/0255695 A1 | * | 11/2005 | Shimada | 438/637 |
| 2007/0178699 A1 | * | 8/2007 | Schaller et al. | 438/689 |
| 2008/0036092 A1 | * | 2/2008 | Gambino et al. | 257/774 |
| 2009/0170325 A1 | * | 7/2009 | Jung | 438/694 |
| 2009/0258495 A1 | * | 10/2009 | Chan | 438/694 |
| 2009/0258501 A1 | * | 10/2009 | Chan | 438/703 |
| 2010/0065531 A1 | * | 3/2010 | Kiehlbauch et al. | 216/41 |

* cited by examiner

*Primary Examiner* — Scott B Geyer
(74) *Attorney, Agent, or Firm* — Slater & Matsil, L.L.P.

(57) ABSTRACT

Methods for improving post etch in via or trench formation in semiconductor devices. A preferred embodiment comprises forming a re-capping layer over a dielectric film following an initial etch to form a feature in the dielectric film, followed by additional etch and etch back processing steps. The re-capping method provides protection for underlying films and prevents film damage post etch. Uniform feature profiles are maintained and critical dimension uniformity is obtained by use of the methods of the invention. The time dependent dielectric breakdown performance is increased.

17 Claims, 12 Drawing Sheets

|  | STD | Re-cap 100A |
|---|---|---|
| PCM mean | 66.8 | 60.9 |
| SRAM mean (VIA-VIA) | 57.3 | 58.1 |
| SRAM mean space | 72.3 | 75.9 |
| SRAM-RY mean spacing | 43.0 | 49.7 |
| SRAM-RY min. space | 29.0 | 40.9 |

Via AEI / API

FIGURE 12

POST ETCH DIELECTRIC FILM RE-CAPPING LAYER

This application claims the benefit of U.S. Provisional Application No. 61/112,584, entitled "Post Etch Dielectric Film Re-Capping Layer," filed on Nov. 7, 2008, which is incorporated herein by reference.

TECHNICAL FIELD

The present invention relates generally to semiconductor processing and methods for improving post etching characteristics of dielectric films for vias or for trench etching. More particularly, in some embodiments, the invention relates to a method for providing a post etching re-capping layer over a dielectric film to improve critical dimension (CD) and time-dependent-dielectric-breakdown (TDDB) characteristics of semiconductor devices produced by the process.

BACKGROUND

Generally, semiconductor wafers are produced using photolithography, deposition, etching, damascene and polish steps to form circuitry and conductive layers surrounded by dielectric materials to produce a plurality of integrated circuit dies on a semiconductor wafer.

In conventional semiconductor processing, typically, copper or aluminum conductor layers are formed and patterned as "top level metal" connectors within layers lying above the semiconductor substrate. The substrate, which for this discussion includes semiconductor over insulator or other epitaxial or grown layers, typically has transistors or other devices formed with doped regions that provide p-n or n-p junctions. The transistors are often planar MOS devices and in many processes, complementary MOS devices are formed by providing a p type substrate, N type MOS devices are formed in the substrate, N-wells are formed in the substrate and P type MOS devices are formed in the wells. These devices are frequently paired to form CMOS inverters, which as is known in the art, may be coupled to form logic gates, registers, memories, processors and other functions needed to form an advanced integrated circuit.

To complete the integrated circuit, electrical connections are formed using dielectrics, including without limitation high K and low K dielectric materials, as well as oxides, nitrides, and other dielectrics known to those skilled in the art, and metallization layers separated by the insulating layers. The metal layers are patterned as conductive lines. Vias are used to vertically couple these conductors. The conductors may be formed of aluminum and its alloys, copper and its alloys, and other conductive materials. If aluminum is used for conductors, a deposit, pattern, and etch process is used to form the conductors. If copper is used, a single or dual damascene process using a film deposition, photolithography, etch and chemical mechanical process (CMP) to remove excess material over the filled trenches may be used. Presently, copper or an alloy of copper is often used with single and dual damascene processes.

The etching process used in the conventional back end of the line (BEOL) metallization and patterning steps will damage film quality. This impacts, among other objective reliability criteria, the TDDB. Conventional approaches to improve the film quality after etch include photoresist (PR) trimming, CD shrinkage and others. These process improvements usually involve polymerizing using etch techniques and therefore are subject to etching profile damage. Critical dimension uniformity (CDU) will also be impacted negatively by these steps. For improving process TDDB, CD shrinkage from, or with PR trimming are usually used. However the capabilities of the photolithography process remain a bottleneck for advanced semiconductor process technology.

FIG. 1 depicts, in a cross sectional view, an intermediate stage of a conventional BEOL copper semiconductor process. In FIG. 1, a metal layer 101 is shown that was previously formed by, for example, typical copper metallization steps such as electro-deposition and CMP over a semiconductor substrate (not shown). An etch stop layer (ESL) 103 is shown overlying the metal layer 101. This ESL layer will be used to stop etch processes above the metal layer 101 in subsequent process steps. Overlying the ESL layer 103 is a dielectric layer 105. Presently, so-called low-K dielectric materials may be used. Low-K dielectrics have a dielectric constant lower than that of silicon dioxide (about 3.5). Recently, extreme low-K or ELK materials are also being used; these have a dielectric constant below 2.0. Alternative dielectric materials include oxides, nitrides, and even high-K dielectrics, but low-K materials are preferred presently for insulation between the metal layers.

Overlying the dielectric layer 105 is a layer of dielectric anti-reflective coating (DARC) 107. DARC is used to prevent unwanted reflections from interfering with the exposure of photoresist in subsequent processes. Overlying the DARC is a bottom anti reflective coating layer (BARC) 109. BARC layer 109 is also used to prevent unwanted reflections from interfering with subsequent photoresist processes.

Overlying the BARC layer 109 is a layer of photoresist (PR) 111 that has already been patterned. PR patterning is accomplished by exposure and development to form a pattern for etching. The etch process is selective so that areas protected by the PR are not etched, and areas exposed to the etchant are etched, with the ESL stopping the etching.

In this simple cross section, three via positions 102, 104 and 106 are shown, similar process steps may be used to form trenches, for example, as well as vias. The vias will, when finally completed, be filled with a conductive material and form connections between metal layer 101 and the next metal layer formed above layer 101 in a multiple level metallization scheme as is typically used. For example if copper layer 101 was "metal 1", then the next metal layer formed above the structure of FIG. 1 would be "metal 2". If instead, layer 101 were "metal 5" then the next overlying layer of metal would be "metal 6". Modern semiconductor processes may have as few as one metal layer and possibly many more metal layers. The vias are used to electrically couple the conductors on different layers by forming vertical connections through the dielectric layers.

FIG. 2 depicts the structure of FIG. 1 following additional processing steps. In FIG. 2 the vias (alternatively, trenches) 102, 104 and 106 are shown etched through the DARC layer 107 and the dielectric layer 105 to the ESL layer 103. Etching is well known in the art and typical processing steps may be used such as RIE and plasma etch processes. Wet and dry etch may be used.

FIG. 3 depicts the structure of FIG. 2 following still more processing steps. In FIG. 3, sacrificial plug material is used to fill the vias 102, 104 and 106. This via fill material will be removed later and is provided to protect the sidewalls and bottom of the low-K via hole structure. An etch back step is performed to remove some of the via fill material at the top of the vias adjacent DARC layer 107. In this manner, the DARC layer may be thinned or etched to reduce the thickness of the DARC layer.

FIG. 4 depicts in two views the structure of FIG. 3 following additional processing steps. In FIG. 4, the upper portion depicts a plan view of the vias 102, 104 and 106 and the conductor trenches 117 being formed for the metal trenches Mx. The metal layer Mx could be any metal layer overlying a previous metal layer, (for example metal layer 7 would be M7) and will typically be formed using dual damascene or single damascene processes, with copper deposited in the vias and the trenches overlying the vias, and then a copper metal polishing (CMP) step to remove excess material from the conductor regions to complete both the vias and the overlying conductors.

In the lower portion of FIG. 4 the cross section taken along the dashed line A-A' through the via portions 102, 104 and 106 is shown. A second BARC layer 110 is now provided overlying the structure and adjacent the DARC layer 107. A second layer of PR 112 is provided and patterned to set up the removal of the via filler 113 by another etch step to complete the vias.

FIG. 5 depicts the completed vias 102, 104 and 106 in the structure of FIG. 4 after additional processing steps. The second PR layer 112, and the second BARC layer 110 are removed following the etch process to remove material 113 from the vias. As can be seen, the tops of the vias 102, 104 and 106 are rounded and sloped. The shape is due to the etch processes which damage the DARC film 107 and the top portions of the dielectric layer 105 within the via regions 102, 104 and 106. This etch damage causes non uniform spacing, lower minimum spacing between the vias, between vias and lines, and line to line spacing.

FIG. 6 depicts in a close up cross section an example via 115 produced using the conventional processes described above. As can be seen, the sides of the dielectric layer 105 and the DARC layer 107 forming the via 115 are sloped to open wider at the top of the via. In the conventional process, the top critical dimension and the etch stop layer will be damaged by the use of the etch processes. Top opening, or bowing profile vias, or even ESL punch through may occur. This can cause "bird beak" effects, for example.

FIGS. 7A and 7B depict actual test structures formed in a conventional semiconductor process using the process steps of FIGS. 1-6. In FIG. 7A, a pair of vias is shown in a SEM photograph looking down on via structures from above. The via shapes can be seen to be elongated near the center. In FIG. 7B, a SEM of the overlying conductors formed on the vias of FIG. 7A is shown in a SEM photo. The minimum spacing between lines formed over these vias is shown to be 21 nanometers, less than the desired minimum spacing. This minimum spacing design violation is due to the irregular shaped opening at the top of the vias. The design parameters are not being met in this example, as the etch process is causing the spacing to change.

One disadvantage of the prior art is that the known approaches to improving the TDDB and via shape post etch problems also have disadvantages. The PR trimming and CD shrinkage of deposition mode in etching processes used in the prior approaches tend to induce additional profile damage. CD uniformity control will then be worse than if these techniques were not used.

A second disadvantage of the prior art is that the various approaches add complexity to the semiconductor processing and thus tend to increase cost and process time. In spite of the additional steps, the photolithography processes tend to limit the advance of semiconductor processing. A continuing need thus exists for semiconductor process methods to improve the TDDB reliability, maintain CD uniformity, and maintain via to via, via to line, and line to line spacing parameters in the semiconductor devices produced, with low cost and without the disadvantages of the known solutions used in the prior art.

SUMMARY OF THE INVENTION

These and other problems are generally solved or circumvented, and technical advantages are generally achieved, by illustrative embodiments of the present invention which provide methods for re-capping an ARC layer to improve the etch process for vias or trenches, to enhance the TDDB parameter for the devices, to maintain spacing uniformity between vias and between vias and lines, and between lines, and to improve the CD uniformity.

In accordance with an exemplary embodiment of the present invention, a method for improving the post etch profile of a via or trench through dielectric films is provided, wherein following a first etch process to form the feature, a re-capping deposition of additional film is performed at the remaining top ARC layer. Subsequent etching steps then do not damage the films, the profiles of the etched features are maintained, critical dimension uniformity is achieved, and minimum spacing between features such as vias, vias to line, and line to line, is increased. The time dependent dielectric breakdown (TDDB) parameter is increased.

In accordance with another exemplary embodiment of the present invention, a method for forming a via through a dielectric overlying an etch stop layer comprises depositing a first layer of antireflective coating over the dielectric, depositing a second antireflective coating, depositing a photoresist, patterning the photoresist to define the vias, etching to form the vias using the etch stop layer to stop the etching and removing the photoresist and the second antireflective coating. A re-capping step is performed, depositing additional film material on the remaining first antireflective coating. The vias are then filled with a sacrificial material, an etch back step is performed, another layer of antireflective coating is deposited, another layer of photoresist is deposited, the additional layer of photoresist is patterned to remove the via filler material, another etch process is performed and the finished vias have a reduced thickness layer of the first antireflective coating at the top of the via.

Embodiments of the present invention improve CD uniformity, TDDB performance, and spacing. Damage to films in the dielectric layers and the etch stop layer is reduced, the vias achieved maintain a more uniform profile, the methods protect against interface damage or depletion, post etch striation and "bird beak" effects are reduced, and when an extreme low K dielectric is used, the re-capping step provides good adhesion to this layer.

A further advantage of certain embodiments of the present invention is that the formation of trenches in dielectric films may be improved by recapping the dielectric films following a first etch process to define the feature, then the additional etchback and etch steps will not damage the films defining the trench and the uniformity of the trenches formed will be increased.

BRIEF DESCRIPTION OF THE DRAWINGS

For a more complete understanding of the present invention, and the advantages thereof, reference is now made to the following descriptions taken in conjunction with the accompanying drawing, in which:

FIG. 7A is a plan view of vias, and FIG. 7B is a plan view of conductors overlying the vias;

FIG. 11A is a plan view of vias, and FIG. 11B is a plan view of conductors overlying the vias; and FIG. 12 depicts a table illustrating comparisons of measured feature distances for a standard process device and a device produced using an exemplary method of the present invention.

The figures are illustrative, and are not to scale, and some features may be omitted for clarity. Like reference numerals for like elements are used.

DETAILED DESCRIPTION

The making and using of the exemplary embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely via formation between metal layers in a copper semiconductor process. The invention may also be applied, however, to other feature formations where etching would otherwise damage films, for example, in forming trenches using etch steps. The methods of the present invention are not limited to a particular process or feature size.

Figure 1:
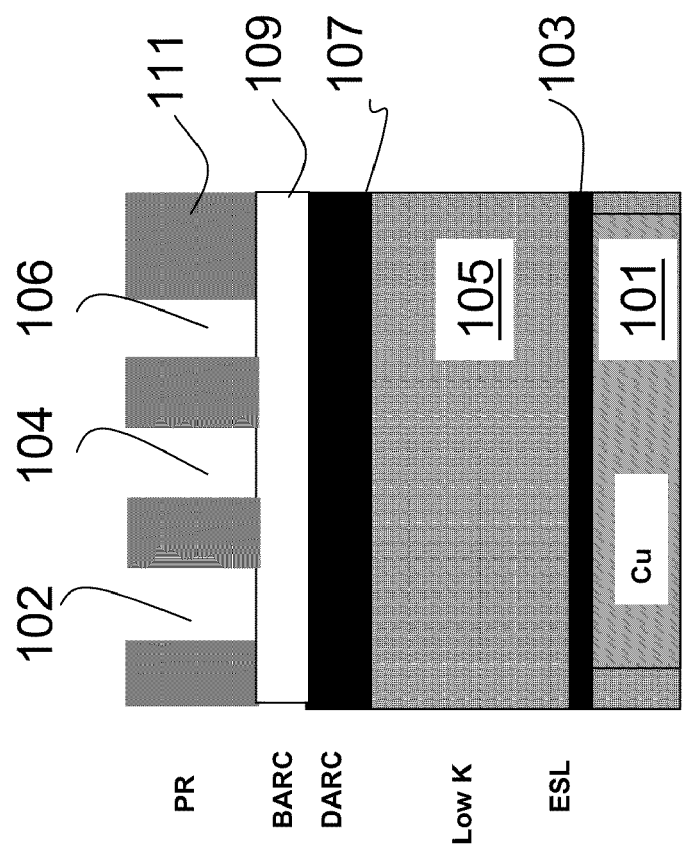
FIG. 1 is a cross sectional view of an intermediate stage semiconductor device where vias will be formed.
Figure 2:
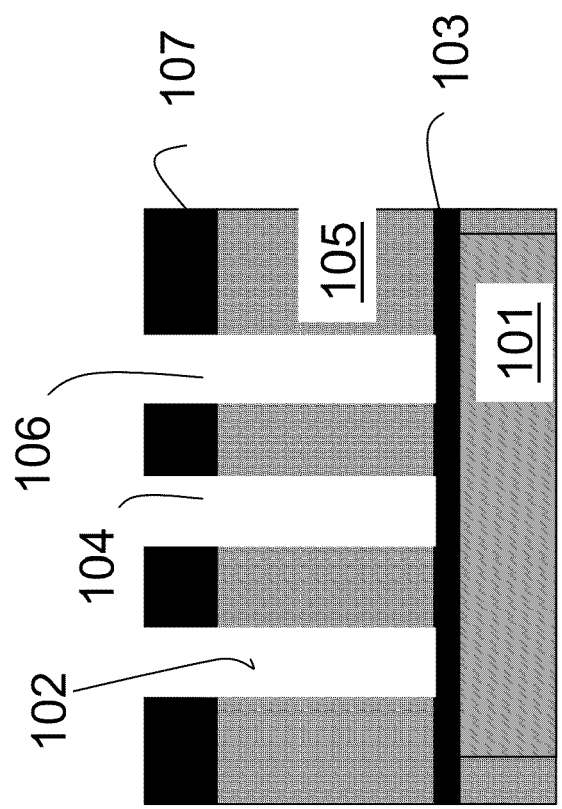
FIG. 2 is another cross sectional view of the device of FIG. 1 following additional processing steps.
Figure 3:
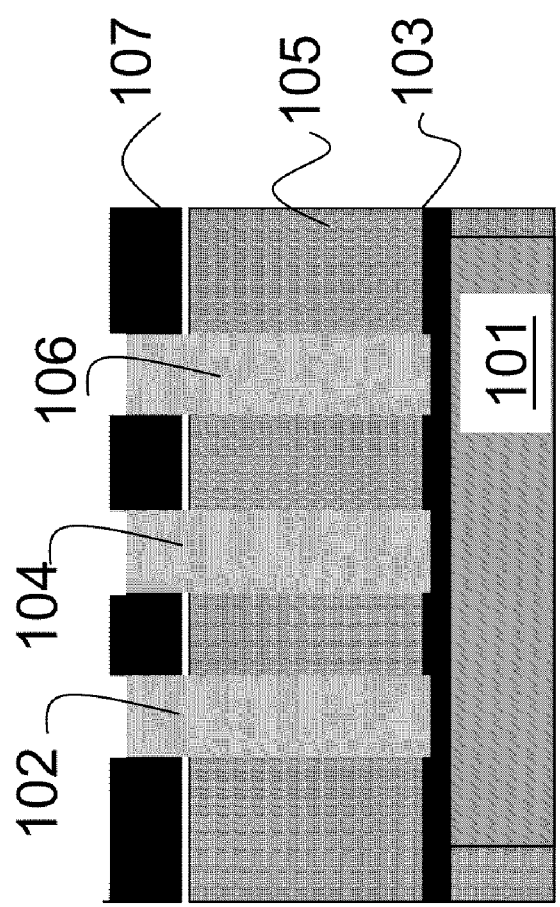
FIG. 3 is a another cross sectional view of the device of FIG. 2 following additional processing steps.
Figure 8:
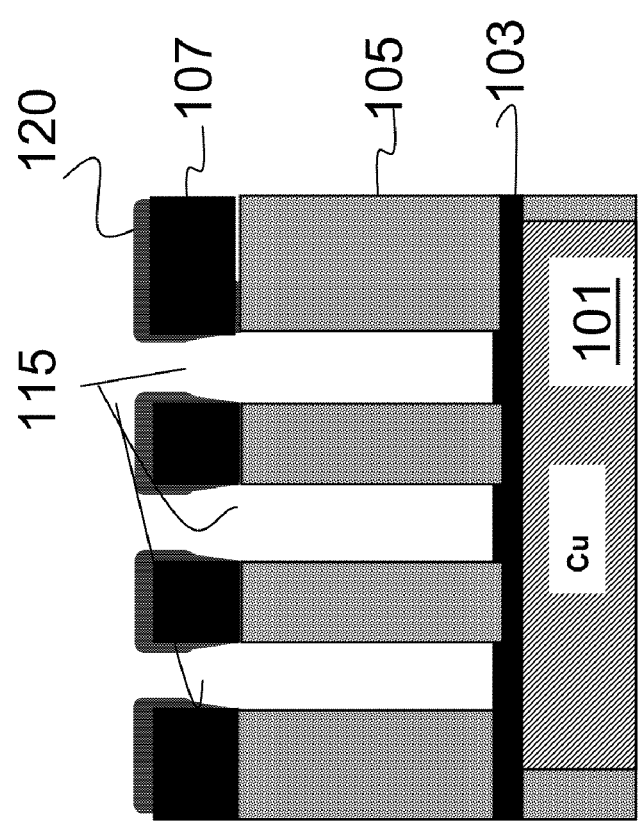
FIG. 8 is a cross sectional view of a semiconductor structure at an intermediate stage depicting the added re-capping layer provided by an exemplary method embodiment of the present invention.

In FIG. 8, a structure formed using an exemplary method is shown in cross section. This figure shows the result of an additional method step performed between the via etch step of FIG. 2 in the conventional process, and the via filling step of FIG. 3. The novel additional step in one exemplary embodiment is to perform a re-capping on the DARC film layer 107 by forming an additional layer 120. The layer 120 may comprise, in one embodiment, the same material used for the DARC layer. In other embodiments, a film of a differing composition may be used. The thicknesses of the additional dielectric re-capping layer 120 may be, for a current process example, between 75-200 Angstroms, and may range from 30-300 Angstroms, depending on the process in which the re-capping layer 120 is used.

A variety of materials may be used for the re-capping layer. The material chosen should in various embodiments should have good adhesion to the low-K or ELK dielectric layer, and be compatible with the photoresist used. Nitrogen-free ARC or NF ARC is one possible material that may be selected for layer 120 although the re-capping method is not limited to these materials. Exemplary ARC layers that might be used for re-capping are materials having SiwCxOyHz, where w, x, y, and z are integers indicating a compound formula. For example, SiC, SiO2, SiCO, or SiCOH may be used. In some applications, a nitrogen containing dielectric such as SiN or SiON may be used as well.

In measuring and qualitatively analyzing semiconductor processes, an inspection after etch procedure is typically used and measurements taken on features. The via after etch inspection (AEI) critical dimension (CD) shrinkage in an example process where an example embodiment of the invention was applied was observed to be from 2-10 nanometers, depending on the dielectric film thicknesses and the deposition methods used.

Figure 4:
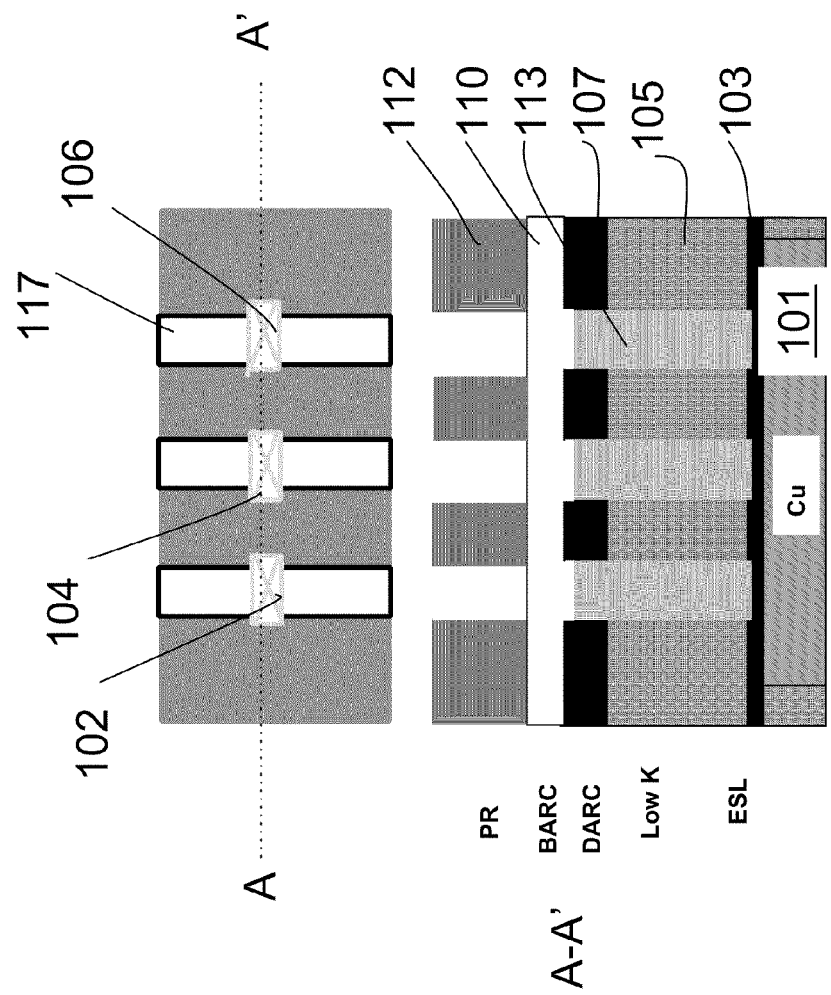
FIG. 4 depicts in a plan view and in another cross sectional view the device of FIG. 2 following additional processing steps.
Figure 5:
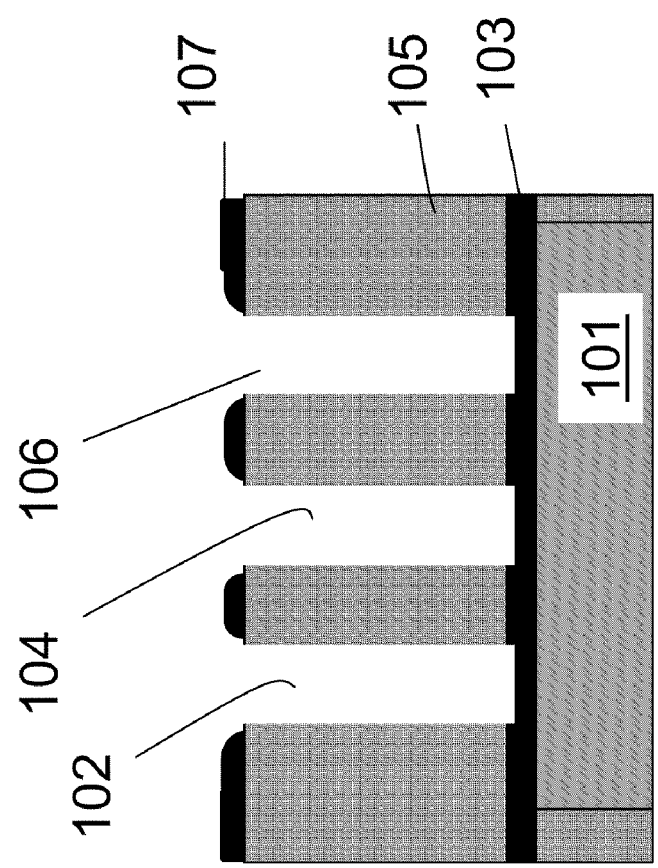
FIG. 5 is a cross sectional view of the structure of FIG. 4 including vias produced in a dielectric layer using conventional process steps.
Figure 6:
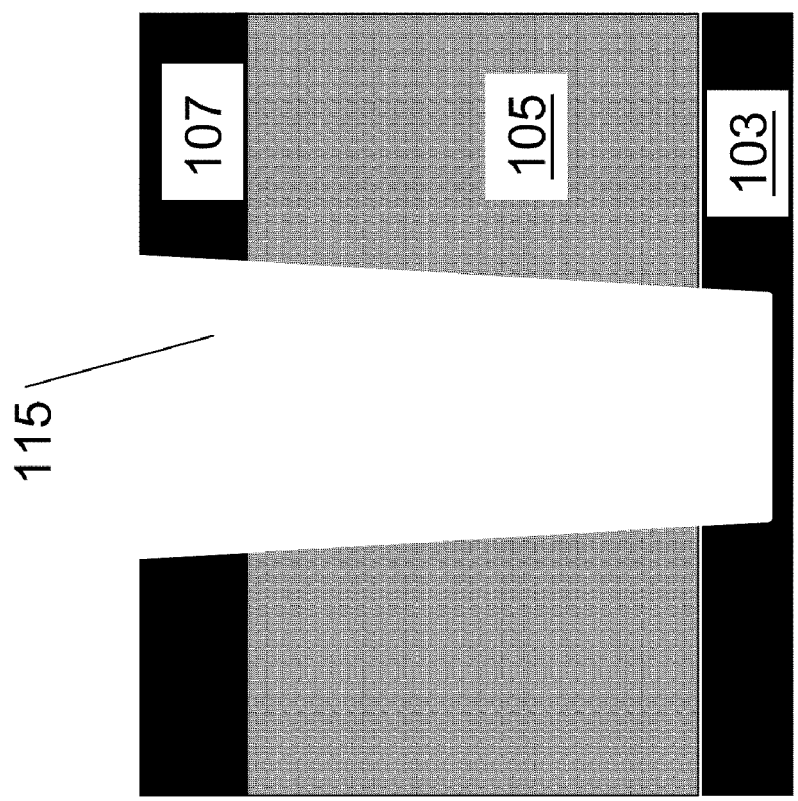
FIG. 6 is a close up cross sectional view of one of the vias of FIG. 4.
Figure 9:
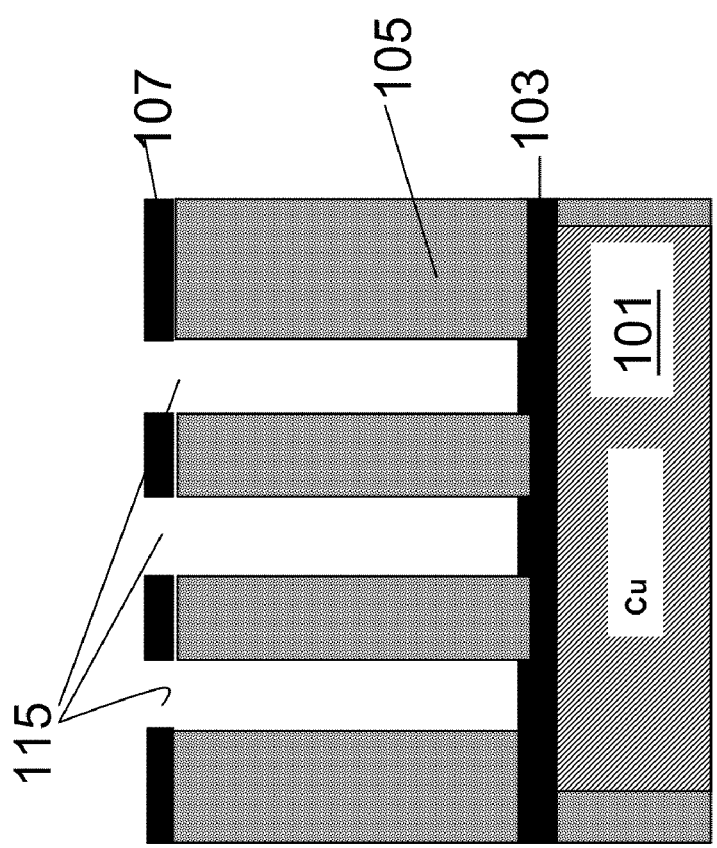
FIG. 9 is a cross sectional view of the structure of FIG. 8 following additional processing steps.

FIG. 9 depicts, in a cross sectional view, the structure obtained for the re-capped DARC via structure of FIG. 8 after the remaining via or trench process steps, such as described above with respect to FIGS. 4-6 are performed. As can be seen from FIG. 9, the sidewalls of the vias 115 are now vertical (no slope or widening at the top) and the remaining layer 107 of DARC material has sharp sidewalls, not rounded. The use of the re-capping step of the preferred method has protected the ARC and ELK films and has reduced, or eliminated, post etch damage as seen in the prior art.

Figure 10:
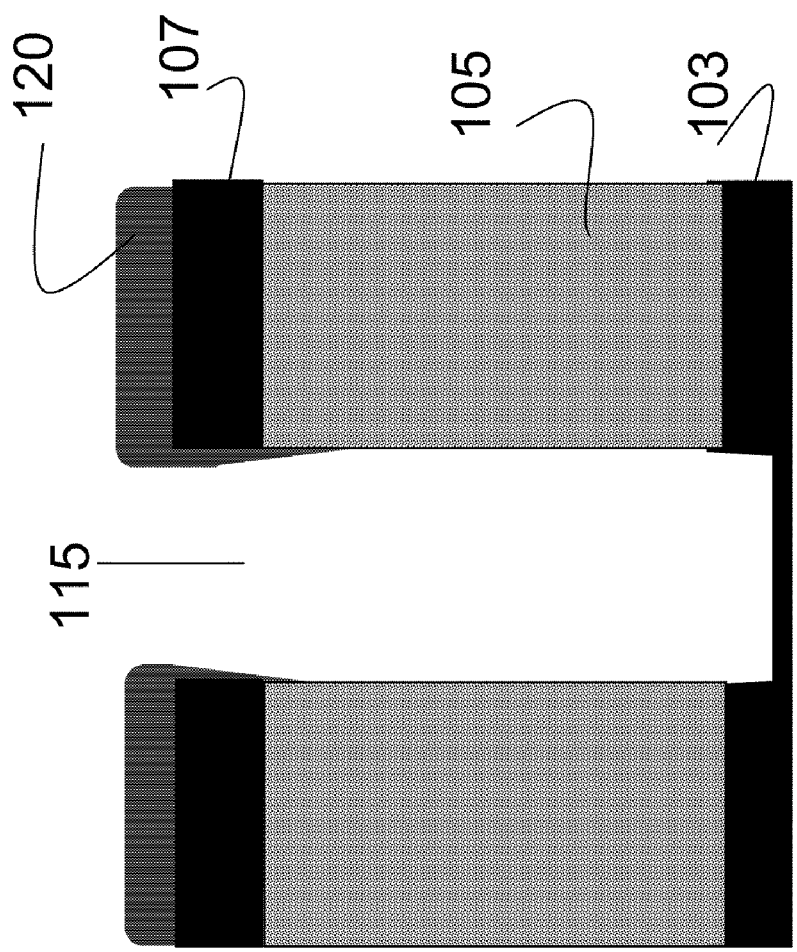
FIG. 10 is a close up cross sectional view of a via of FIG. 9 produced using an exemplary method embodiment of the present invention.

FIG. 10 depicts in a close up cross sectional view the sidewall profile of a via 115 obtained with the recapping layer 120 applied to DARC layer 107. The vertical profile obtained using the dielectric capping layer provides physical improvement in the process as well as reliability improvement over the conventional processes. By maintaining the vertical slope, the feature dimensions (critical dimensions) are maintained at the designed sizes. Via spacing uniformity will therefore be maintained, as each via opening will maintain its original shape and size throughout the post etch processes.

Figure 7B:
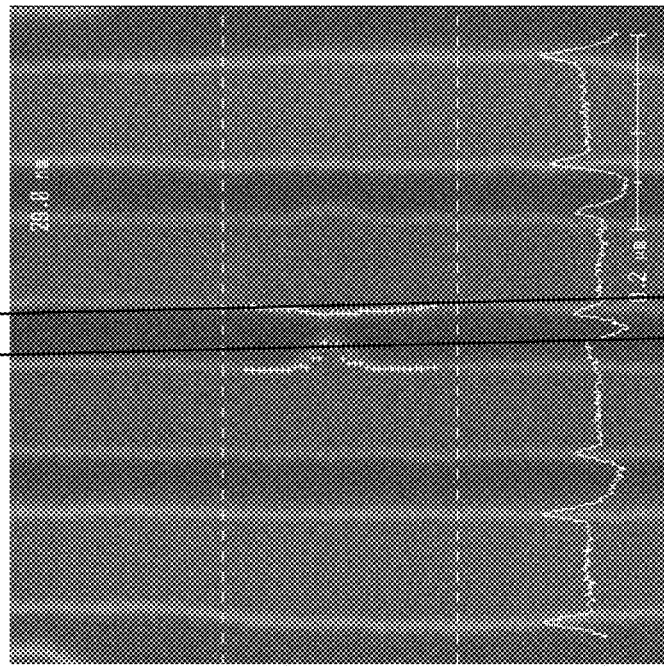
FIGS. 7A and 7B depict test structures produced using conventional process steps.
Figure 7A:
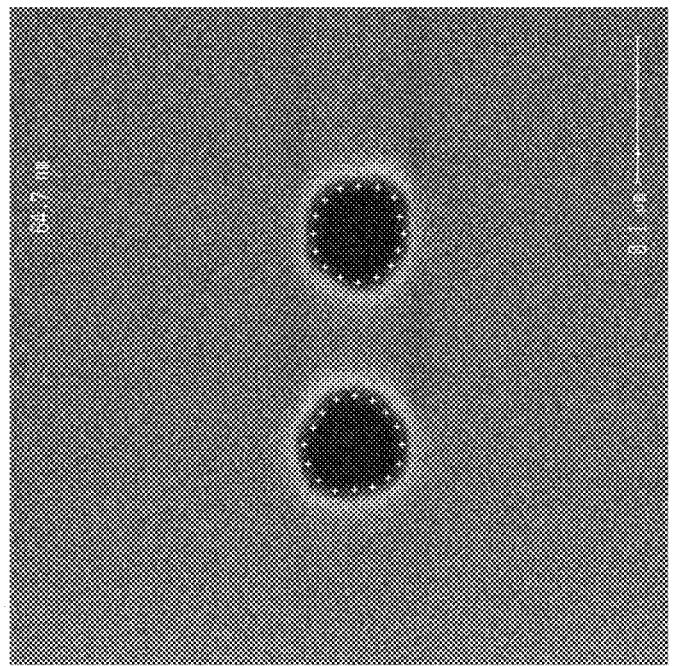
Figure 11B:
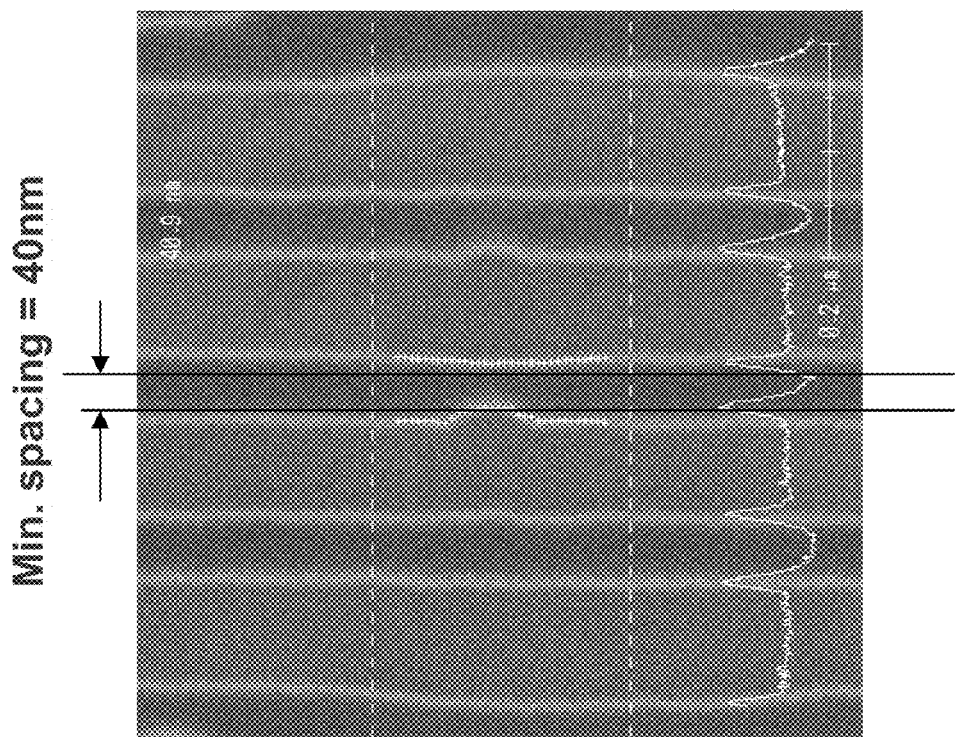
FIGS. 11A and 11B depict test structures produced using an exemplary method embodiment of the present invention.
Figure 11A:
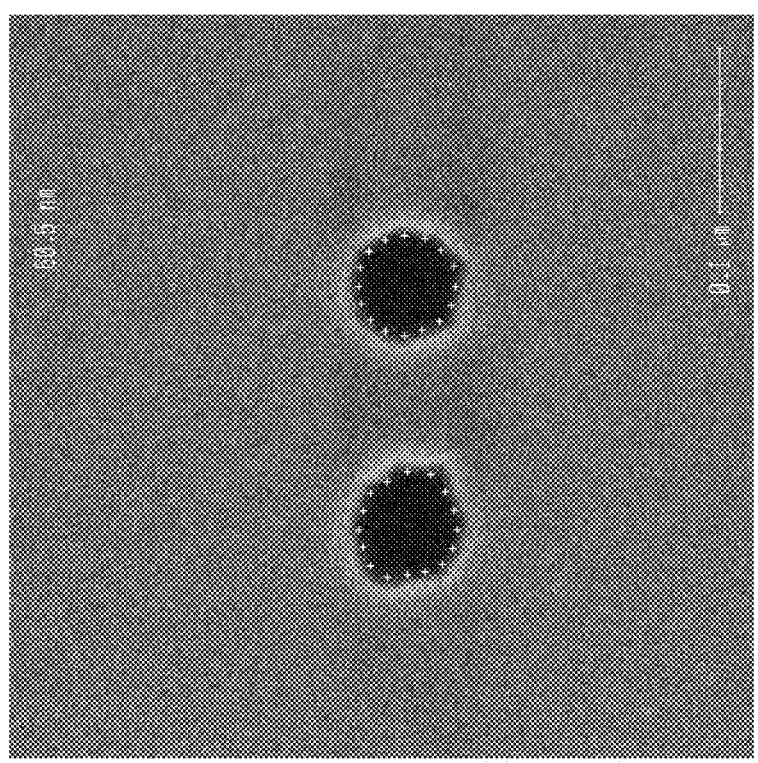

FIGS. 11A and 11B provide two views of an actual test structure produced using an exemplary method embodiment of the present invention in the semiconductor process as for FIGS. 7A and 7B, the process now being modified by the use of the re-capping method. In FIG. 11A, two adjacent vias are shown in a SEM photo. Shown from above, the regular shapes can be seen. In FIG. 11B, the minimum spacing observed between features on the test structure is shown. Here, the conductors overlying the vias in FIG. 11A are shown in a SEM photo. The minimum spacing obtained is now 40 nanometers, a 90% increase compared to the SEM of FIG. 7B which showed a 20 nanometer spacing. This improvement is obtained using the method embodiments of the invention.

FIG. 12 depicts in a table form some comparison data obtained from test devices produced using the standard process flow without the use of the embodiments of the invention, and for devices implemented using the re-capping method embodiments for the dielectric layer used to protect and enhance the via structures, where a 100 Angstrom thickness recapping film was used. The following abbreviations are used to label rows in FIG. 12: AEI is "after etch inspection", API is "after polish inspection", PCM is an area of the circuit that is the "process control monitor", PCM mean is a measurement of the average, or mean, critical dimension "CD" in the PCM part of an integrated circuit, SRAM is an area of the integrated circuit that is "Static Random Access Memory"; SRAM mean (VIA-VIA) is average or mean spacing measured via-to-via in the SRAM area, SRAM mean space is the average or mean distance of spacing between via-to-via; SRAM-RY is a circuit area implementing a particular SRAM example layout RY, SRAM RY mean spacing is an average or mean spacing measure in the circuit area containing SRAM-RY, and SRAM-RY min. space is the minimum spacing on via to trench in the SRAM-RY portion of the integrated circuits. In FIG. 12, the column labeled "STD" is for devices fabricated without the re-capping layer. The column labeled "Recap" is for devices implemented when one of the re-capping embodiments was used. In an after etch inspection (AEI) of certain areas in these ICs, use of the embodiments caused the SRAM mean via-to-via spacing to increase, and the SRAM mean space to increase, while the PCM mean spacing decreased.

Also as shown in FIG. 12, in the portion labeled API, the SRAM-RY mean spacing (the spacing between lines labeled in the SRAM-RY array) increased by 6 nanometers, and the SRAM-RY minimum spacing increased from 29.0 to 40.9 nanometers.

The re-capping methods of the exemplary illustrative embodiments described above may also be advantageously used for trench formation. These methods and the structures produced are additional alternative exemplary embodiments of the invention. Again, a re-capping film is deposited on the DARC dielectric to prevent post etch damage and CD non-uniformity in subsequent etch steps for forming the trench. The use of the exemplary embodiments in trench formation will improve the CMP polish window for the process.

Advantages of the use of the various embodiment methods are that CD uniformity is maintained. The re-capping of the invention maintains via and trench feature dimensions throughout the post etch processes. As a result, AEI CD shrinkage is reduced and CD striation is improved. Extreme low-K film damage protection is provided. Spacing between vias, from via to line, and from line to line is maintained without the disadvantages of the prior art. The protection of the ELK film results in the TDDB parameter for the process being improved, the breakdown voltage VBD for the vias is improved, and the resistance Rc is comparable to the conventional processes.

The advantages of the use of the exemplary methods may be seen in several tests. For example, CD uniformity will increase. AEI CD shrinkage will improve. When extreme low-K dielectrics (ELKs) are used, ELK damage protection will increase. Wafer acceptance test (WAT) leakage window measurements will improve, and reliability analysis TDDB will improve.

The use of the exemplary embodiments may also provide additional features over conventional semiconductor processes. Post etch deposition of the re-capping layer may reduce or avoid film damage caused by subsequent exposure to etch plasma processes. The interfaces may be protected from damage or depletion by subsequent processing. The post etch striation observed and so called "bird beak" effects may be improved. Adhesion characteristics to ELK materials may be improved by the additional re-capping layer Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that the re-capping material may be varied, as it could be the same material for the dielectric film or another film material, while remaining within the scope of the present invention.

Moreover, the scope of the present application is not intended to be limited to the particular illustrative embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method forming a via in a dielectric layer, comprising:
providing a semiconductor structure having the dielectric layer overlying a conductor layer;
forming a first antireflective coating (ARC) overlying the dielectric layer;
forming a second ARC coating overlying the first antireflective coating;
forming a photoresist layer over the second antireflective layer;
patterning the photoresist layer;
developing the photoresist layer to form areas covered by photoresist and exposed areas not covered by the photoresist corresponding to the patterning;
etching the photoresist layer and the exposed areas to form via holes in the dielectric layer;
removing the photoresist material and the second ARC coating; and
re-capping the remaining first ARC coating with another ARC coating to form a re-capped ARC layer;
wherein re-capping the remaining first ARC coating comprises forming a coating one selected from the group of SiC, SiCO, SiOH, SiO2, SiO, SiCH, SiN, and SiON.

2. The method of claim 1, wherein re-capping the first ARC coating comprises forming the same material as the first ARC coating.

3. The method of claim 1, wherein re-capping the first ARC coating comprises forming a nitrogen-free material.

4. The method of claim 1, wherein another ARC coating used to form the re-capped ARC layer has a thickness of between 30 and 300 Angstroms.

5. The method of claim 1, and further comprising:
forming sacrificial plugs within the via holes;
etching back the top portion of the sacrificial plugs in the via holes;
depositing a third ARC layer over the re-capped ARC layer and the plugs;
forming a second photoresist layer over the third ARC layer;
patterning the second photoresist to define trenches; and
etching the trenches and via holes, removing the sacrificial plugs from the via holes.

6. The method of claim 5 and further comprising:
removing the second photoresist and the third ARC layer; and
forming metal plugs in the via holes and conductors in the trenches of a copper material.

7. The method of claim 6 and further comprising:
removing the re-capped ARC layer and the first ARC coating by CMP.

8. A method for forming vertical etch profile in a dielectric, comprising:
providing a semiconductor structure;

forming a dielectric layer, a dielectric ARC (DARC) layer, a backside ARC (BARC) layer, and a photoresist layer overlying the semiconductor structure;

patterning the photoresist layer to define features to be etched;

etching the DARC layer, the BARC layer and the dielectric layer using the photoresist as a mask; and re-capping the DARC layer with a nitrogen free material by forming a re-capping layer of additional DARC material to modify the vertical profile of the etched features.

9. The method of claim 8, wherein re-capping the DARC layer comprises forming a re-capping layer coating of material one selected from the group of SiO2, SIC, SICO, SICH, SIOH, SION, and SiN.

10. The method of claim 8 wherein the re-capping layer coating is formed to be between 30-300 Angstroms thick.

11. The method of claim 8 wherein the dielectric layer is a low-K dielectric.

12. The method of claim 8 wherein the dielectric layer is an extreme low-K dielectric.

13. The method of claim 8 and further comprising:
forming a copper based conductor layer underlying the dielectric layer and overlying the semiconductor structure, and
forming an etch stop layer overlying the conductor layer and underlying the dielectric layer.

14. A method for forming vertical via holes in a copper based multi-layer metallization system for an integrated circuit, comprising:
providing a semiconductor structure having integrated circuits defined thereupon;
forming a copper based metallization layer overlying the semiconductor structure;
forming an etch stop layer overlying the metallization layer;
forming a dielectric layer overlying the etch stop layer;
forming a dielectric ARC (DARC) layer overlying the dielectric layer;
forming a backside ARC (BARC) layer overlying the DARC layer;
forming a photoresist layer over the BARC layer;
patterning the photoresist layer to define vias to be etched;
etching the DARC layer, the BARC layer and the dielectric layer using the photoresist as a mask;
removing the photoresist and the BARC layer;
re-capping the DARC layer to modify the vertical profile of the etched vias;
forming sacrificial plugs within the via holes;
etching back the top portion of the sacrificial plugs in the via holes;
depositing a third ARC layer over the re-capped ARC layer and the plugs;
forming a second photoresist layer over the third ARC layer;
patterning the second photoresist to define trenches; and
etching the trenches and via holes, removing the sacrificial plugs from the via holes.

15. The method of claim 14 wherein re-capping the DARC layer further comprises forming a nitrogen free DARC layer.

16. The method of claim 14 wherein re-capping the DARC layer further comprises forming an additional DARC layer one selected from the group of SiC, SiCO, SiOH, SiO2, SiO, SiCH, SiN, and SiON.

17. The method of claim 14 wherein re-capping the DARC layer further comprises forming the same material as the first ARC coating.

* * * * *